United States Patent
Deshayes

(10) Patent No.: US 10,383,246 B2
(45) Date of Patent: Aug. 13, 2019

(54) ELECTRICAL DISTRIBUTION BOX COMPRISING AN INPUT POWER BUSBAR

(71) Applicant: ZODIAC AERO ELECTRIC, Montreuil (FR)

(72) Inventor: Olivier Deshayes, Rosny-sous-Bois (FR)

(73) Assignee: Zodiac Aero Electric, Montreuil (FR)

( * ) Notice: Subject to any disclaimer, the term of this patent is extended or adjusted under 35 U.S.C. 154(b) by 0 days.

(21) Appl. No.: 15/240,934

(22) Filed: Aug. 18, 2016

(65) Prior Publication Data
US 2017/0181310 A1  Jun. 22, 2017

Related U.S. Application Data

(63) Continuation of application No. PCT/EP2015/053609, filed on Feb. 20, 2015.

(30) Foreign Application Priority Data

Feb. 21, 2014 (FR) ..................... 14 51394

(51) Int. Cl.
*H02G 3/08* (2006.01)
*H05K 7/14* (2006.01)

(52) U.S. Cl.
CPC ........... *H05K 7/1457* (2013.01); *H02G 3/081* (2013.01); *H02G 3/086* (2013.01); *B64D 2221/00* (2013.01)

(58) Field of Classification Search
CPC .. H05K 7/1457; B64D 2221/00; H02G 3/081; H02G 3/086
See application file for complete search history.

(56) References Cited

U.S. PATENT DOCUMENTS

| | | | |
|---|---|---|---|
| 6,504,730 B1 * | 1/2003 | Cooney ................ | H05K 7/1457 174/50 |
| 7,805,204 B2 * | 9/2010 | Ghanekar ................ | H02J 4/00 700/22 |
| 7,974,093 B2 * | 7/2011 | Zeng .................. | H05K 7/20545 165/104.33 |
| 8,416,570 B2 * | 4/2013 | Zeng .................. | H05K 7/20545 165/104.33 |
| 8,810,999 B2 * | 8/2014 | Guering ................... | H02G 3/00 165/104.33 |
| 9,693,474 B2 * | 6/2017 | Guering .................... | H05K 7/02 |
| 2003/0016520 A1 | 1/2003 | Cooney et al. | |

(Continued)

FOREIGN PATENT DOCUMENTS

EP      1 973 018 A2   9/2008
WO  WO 2013/045809 A2   4/2013

*Primary Examiner* — Robert J Hoffberg
(74) *Attorney, Agent, or Firm* — Morgan, Lewis & Bockius LLP

(57) ABSTRACT

An electrical distribution box for an aircraft includes first housings configured to receive power modules, second housings configured to receive electronic control modules, and an interface configured for connection of the power and control modules and external electrical members. The interface includes at least one input power busbar extending into at least one of the first housings for connection to at least one of the power modules. The at least one input power busbar is adapted to be connected to a cable of a wiring harness for connection of the at least one power module to the wiring harness.

19 Claims, 1 Drawing Sheet

(56) References Cited

U.S. PATENT DOCUMENTS

| | | | |
|---|---|---|---|
| 2005/0162830 A1* | 7/2005 | Wortman | H05K 7/20572 |
| | | | 361/695 |
| 2009/0273234 A1 | 11/2009 | Wavering et al. | |
| 2018/0219363 A1* | 8/2018 | Deshayes | B64D 41/00 |

* cited by examiner

ELECTRICAL DISTRIBUTION BOX COMPRISING AN INPUT POWER BUSBAR

CROSS-REFERENCE TO RELATED APPLICATION

This application is a continuation application of International Patent Application No. PCT/EP2015/053609, filed Feb. 20, 2015, which claims priority to French Patent Application No. 1451394, filed on Feb. 21, 2014, which is incorporated herein by reference in its entirety for all purposes.

TECHNICAL FIELD

This disclosure relates generally to electrical energy distribution boxes and more particularly, to an electrical distribution box incorporating removable electrical distribution modules.

BACKGROUND

An aircraft generally has an electrical system including, in particular, a primary electrical energy distribution circuit and a secondary electrical energy distribution circuit. These primary and secondary distribution circuits, also referred to as primary and secondary distribution boxes, make it possible to protect and distribute the electrical power originating from internal sources, for example generators or batteries, or external sources, such as power units or a ground cart, to payloads or to other distribution boxes of the aircraft.

A primary distribution box generally includes a power module, making it possible to manage high electrical power, and an electronic module. The power module, with the aid of cables, transmits energy produced from electrical generators driven by engines.

A secondary distribution box is generally used in an aircraft in order to distribute the electrical energy from a primary source to different systems of the aircraft. A secondary distribution box generally includes a frame fixed on a support in a vehicle such as an aircraft, the frame having a plurality of housings for receiving power modules and/or electronic control modules. The power modules are generally electronic power control boards, also known as solid state power controller (SSPC) boards, which can be configured to deliver an alternating or a direct current. The electronic control modules housed in the secondary distribution box are generally for controlling low-frequency electronic functions of the aircraft, such as communication and calculations, for example.

The power modules interact with the electronic control modules in order to provide the power necessary to control different electrical and electronic elements of the aircraft.

In general, the electrical interfaces of a secondary distribution box are provided through the aid of wired connectors. There are two types of connectors, a power connector for connecting the modules to a cable bundle, also referred to as a wiring harness in aircraft, and a control connector for connecting the modules to a motherboard.

Each SSPC board includes a power connector and a control connector. The power connector is connected on one end to the secondary distribution box via the SSPC board and, on the other end, to the wiring harness.

Generally, the wiring harness is mounted inside the secondary distribution box so as to connect the power cables to the corresponding modules. A configuration of this type has the disadvantage that when one of the modules is faulty and must be replaced, it is necessary to remove the entire secondary distribution box and to disconnect the wiring harness entirely in order to repair or replace the faulty module. This leads to a significant cost in terms of time, in particular with regard to the reassembly of the secondary distribution box in the aircraft. In addition, each wiring harness must be tested.

Conventional electrical distribution systems generally include secondary distribution boxes formed in such a way that the SSPC boards can be individually removed for repair or replacement of the secondary distribution box.

However, in these conventional electrical distribution systems, the secondary distribution box uses a single connector to connect the bundle of cables of the wiring harness. The use of a single connector prevents separation between the upstream power module and the distribution power module downstream of the distribution box.

In addition, the type of connector used makes it necessary to multiply the number of protectors necessary for the upstream power in the primary distribution because all the wires must be protected.

The multiplication of the electrical connectors on the SSPC boards, and the multiplication of the number of protectors in the primary distribution boxes significantly increase the total mass of the electrical system. Furthermore, it is not possible for the high power to pass through the wired electrical connectors given the cost and the rectangular shape of the contacts.

The constraints with regards to the positioning of the power connectors for the wiring harness and of the control connectors for the motherboard result in costly centering and adjustment solutions. Additionally, the total costs of the connectors for a secondary distribution box constitute a significant percentage of the total cost of a secondary distribution box.

The above information disclosed in this Background section is only for enhancement of understanding of the background and therefore it may contain information that does not form art that is already known in this country to a person of ordinary skill in the art.

SUMMARY

Accordingly, in consideration of the above constraints, various embodiments of this disclosure are directed to overcome the above-mentioned disadvantages by providing an electrical distribution box in which the input power connector is replaced with a busbar so as to optimize the interfaces of the secondary distribution boxes.

In accordance with some embodiments, an electrical distribution box for an aircraft includes first housings configured to receive power modules, second housings configured to receive electronic control modules, and an interface configured for connection of the power and control modules and external electrical members. The interface includes at least one input power busbar extending into at least one of the first housings for connection to at least one of the power modules. The at least one input power busbar is adapted to be connected to a cable of a wiring harness for connection of the at least one power module to the wiring harness.

A busbar, or power bar, is a conductive bar coupled on one end, to a source of electrical energy and, on the other end to various electrical members among which the electrical energy received by the busbar is distributed. The source of electrical energy can be a generator in the case of a busbar of a primary electrical distribution box or a primary electrical distribution box in the case of a busbar of a secondary electrical distribution box. The electrical members among which the electrical energy received by the busbar is distributed can be secondary distribution sub-networks or electrical loads.

The replacement of the power connector by a busbar makes it possible to reduce the cost and the mass of the secondary or primary distribution box and to increase the maximum current allowed for the power input, where the busbar is not limited in terms of high power.

Moreover, because input power busbars are connected to a number of power modules, the number of wired connections is reduced and consequently the protectors in the distribution, in particular to the primary distribution, are considerably reduced in number. In effect, only a single protector per busbar is required.

In addition, the constraints with regard to the positioning of the entire electrical connector of the wiring harness are reduced. In effect, the targeted bundles of cables of the wiring harness are connected to a busbar via a single terminal block coupled to the busbar outside the box. The power modules are connected to the busbar by contact between a power connection of the module and the busbar thereof. Because there is no direct connection between a power module and a bundle of cables of the wiring harness, no alignment is necessary.

In some embodiments, the interface further includes at least one output power busbar extending into a first of the first housings for connection to the at least one power module to supply a load or for connection to the electrical distribution box.

The use of a power busbar to deliver an output power to the distribution box makes it possible to use high-power power modules whilst optimizing the integration of the electrical connector and the mass of the electrical connector by reducing the number of connectors overall.

In some embodiments, the interface includes at least one individual output power connector extending into a second of the first housings for connection to a power module in order to supply a load or for connection to the electrical distribution box.

In this way, a distribution box can be used regardless of the configuration of connection over the power modules in order to deliver the output power.

In some embodiments, the electrical distribution box further includes at least one individual input power connector extending into the at least one of the first housings for connection to a power module. The individual input connector is adapted to receive the cable of the wiring harness.

Some housings can thus be dedicated to the power modules, whereas others are dedicated to the control modules. It is also possible in this configuration to separate the distribution box into a distribution module and a secondary distribution module. The first housings of the primary distribution include the busbars so as to receive high power, whereas the first or second housings of the secondary distribution include individual connectors accepting lower power.

In some embodiments, each of the at least one first housings includes both the at least one individual input power connector and the at least one input power busbar. An electrical connection exists between the input power busbar and the individual input power connector.

In a configuration of this type the distribution box may receive power modules having input connectors for individual connectors or for a busbar.

In some embodiments, the electrical distribution box further includes a control motherboard and a main frame including the first and second housings. The control motherboard is mounted on an exterior of the main frame and is configured to be connected to at least one of the first and second housings.

A motherboard mounted outside the distribution box makes it possible to have a standard frame and to manage the number of additional modules of the distribution box. In this way, all the electronic means are independent and are mounted removably on the box.

In some embodiments, the control motherboard includes an input power connector.

By integrating the motherboard in a standard connector, or vice versa, the production costs and total mass of the distribution box are reduced.

In some embodiments, the electrical distribution box further includes at least one additional frame for fixing to the main frame. The additional frame includes at least one of the second housings. The control motherboard is mounted on an exterior of the additional frame for connection to the at least one of the second housings of the additional frame.

The motherboard can be adapted depending on the configuration and number of modules used in the box, but also depending on the number of additional frames fixed to the main frame.

In accordance with some embodiments, an electrical distribution system includes at least one electrical distribution box. The at least one electrical distribution box includes first housings configured to receive power modules, second housings configured to receive electronic control modules, and an interface configured for connection of the power and control modules and external electrical members. The interface includes at least one input power busbar extending into at least one of the first housings for connection to at least one of the power modules. The at least one input power busbar is adapted to be connected to a cable of a wiring harness for connection of the at least one power module to the wiring harness.

In some embodiments, the system includes at least one primary distribution box connected to at least one secondary distribution box, in which the primary distribution box includes secondary distribution modules.

In some embodiments, the system further includes at least one individual input power connector extending into at least one of the first housings for connection to a power module. The individual input connector is adapted to receive a cable of a wiring harness.

In some embodiments, the electrical distribution system further includes a control motherboard and a main frame including the first and second housings. The control motherboard is mounted on an exterior of the main frame and is configured to be connected to at least one of the first and second housings.

The methods and apparatuses of the various embodiments have other features and advantages which will be apparent from or are set forth in more detail in the accompanying drawings, which are incorporated herein, and the following Detailed Description, which together serve to explain certain principles of the various embodiments of this disclosure.

BRIEF DESCRIPTION OF THE DRAWINGS

For a better understanding of the various described embodiments, reference should be made to the Detailed Description below, in conjunction with the following drawings. Like reference numerals refer to corresponding parts throughout the figures and description.

Figure 1:
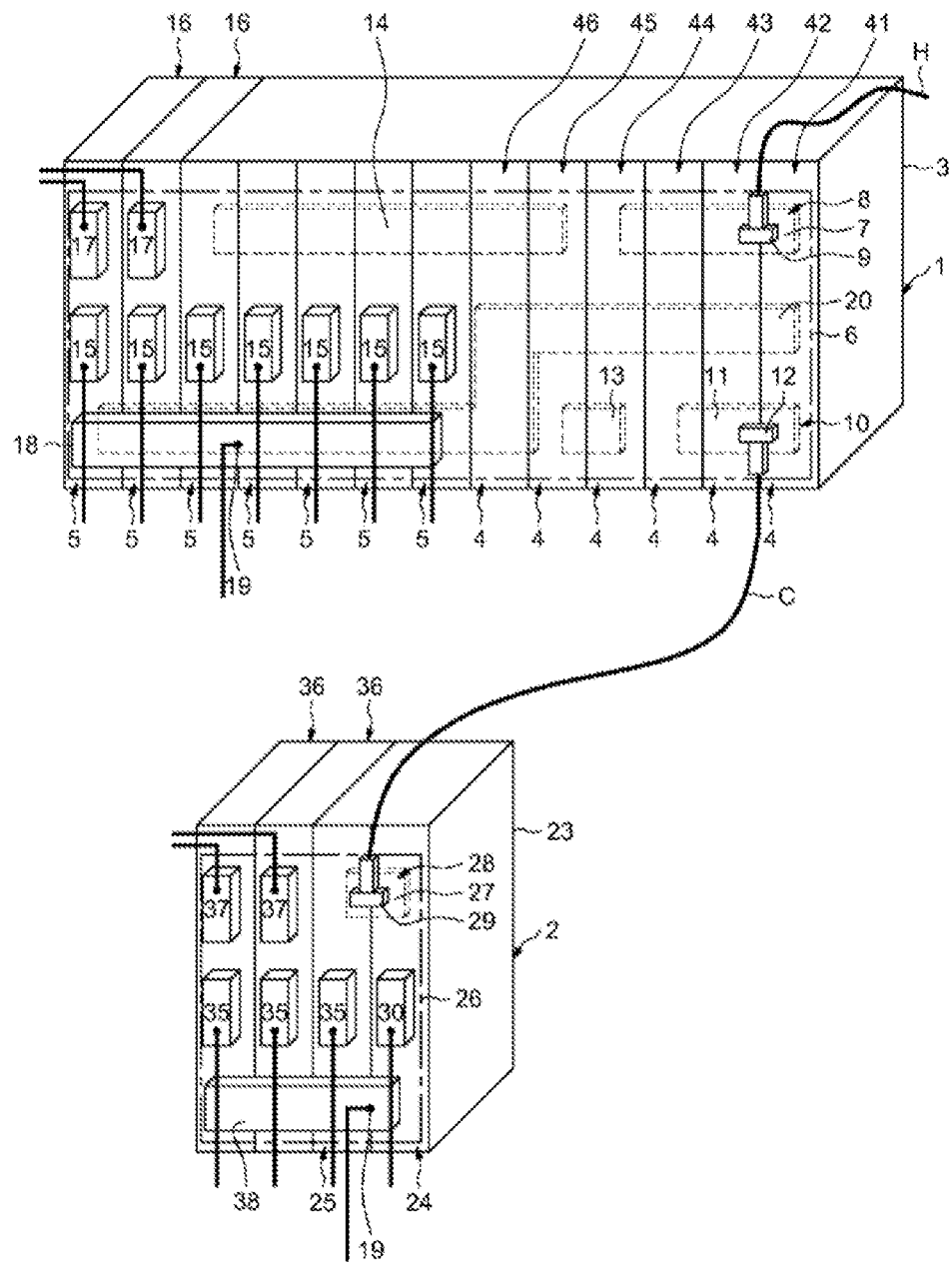
FIG. 1 illustrates, schematically, an electrical distribution system including a primary distribution box and a secondary distribution box in accordance with some embodiments.

It should be understood that the appended drawings are not necessarily to scale, presenting a somewhat simplified representation of various features illustrative of the basic principles of the various embodiments of this disclosure. The specific design features of the various embodiments as disclosed herein, including, for example, specific dimensions, orientations, locations, and shapes will be determined in part by the particular intended application and use environment.

DETAILED DESCRIPTION

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known systems, methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first pair could be termed a second pair, and, similarly, a second pair could be termed a first pair, without departing from the scope of the various described embodiments. The first pair and the second pair are both pairs, but they are not the same pair.

The terminology used in the description of the various embodiments described herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates, schematically, an electrical distribution system comprising a primary distribution box 1 and a secondary distribution box 2 in accordance with some embodiments. In some embodiments, as illustrated in FIG. 1, the primary distribution box 1 includes a main frame 3 configured to be fixed on a support or internal structure of a vehicle, such as an aircraft. The main frame 3 includes at least six power housings 4 and at least five control housings 5. In some embodiments, the primary distribution box 1 may include a number (not equal to zero) of power housings 4 and a different number (which may be zero) of control housings 5. The power housings 4 are configured to receive power modules such as power boards of the solid state power controller (SSPC) type and the control housings 5 are configured to receive electronic control modules such as control boards.

The primary distribution box 1 also includes an interface 6 providing the interconnection between the different power and control modules and external electrical members. The external electrical members may be sources of electrical energy and/or electrical loads or electrical energy distribution sub-networks, in particular the secondary distribution box 2.

The interface 6 of the primary distribution box 1 includes a first input high-power busbar 7 extending over four power housings 4 dedicated to high power and referenced 41 to 44. The first busbar 7 thus makes it possible to supply up to four modules inserted into each of the four high-power housings 41 to 44 with a significant current.

The first busbar 7 includes a conductive bar 8 and a terminal block 9 making it possible to electrically connect the conductive bar 8 to a cable H of a wiring harness (not shown), the cable H of the wiring harness being connected in addition, in some embodiments, to a current generator. The first busbar 7 is disposed so as to have the conductive bar 8 inside the main frame 3 of the primary distribution box 1 and the terminal block 9 outside the main frame 3. In some embodiments, the first busbar 7 may be coupled to a source of energy other than a current generator.

The first busbar 7 requires only a single protector, given that there is just one cable connected to the busbar, although it can supply power to up to four power modules since it extends over four first housings 4.

In these embodiments, in order to reduce the cost and the mass of the primary distribution box 1, the first busbar 7 is not supplemented with individual input power connectors for each of the high-power housings 41 to 44.

In other embodiments, it is possible to supplement the first busbar 7 with individual input power connectors so as to be able to use equally, power modules configured to be electrically connected to the input power with the aid of a busbar and power modules configured to be connected to the input power with the aid of an individual input power connector. In this case, the power housings 4 must additionally include foolproof means to adjust the position of the power modules as these are inserted into the power housings 4 in order to ensure the connection of the power module to the individual connector.

When the power module is coupled to the input power through merely a busbar, the constraints with regard to the positioning of the wiring harness are minimized, because the bundles of cables of the wiring harness are connected to the busbar via a single terminal block, and the power modules are connected to the busbar by contact between a connection of the power module and the conductive bar of the busbar. Furthermore, use of a busbar rather than an individual connector in order to route the input power makes it possible to use greater currents for the power input compared with the power permitted by each of the individual connectors.

In addition, because the power input busbars are configured to be connected to a plurality of power modules, the number of wired connections is reduced and consequently the number of protectors in the primary distribution box is considerably reduced. In effect, only a single protector per busbar is required.

In some embodiments, the interface 6 of the primary distribution box additionally includes a first output power busbar 10 extending over the three first high-power housings 41, 42, and 43, of the four high-power housings 41, 42, 43 and 44 so as to be able to connect up to three power modules, configured to be inserted into the three first high-power housings 41, 42, and 43, to an electrical load or the secondary distribution box 2. In these embodiments the first output power busbar 10 includes a conductive bar 11 mounted inside the main frame 3, and a terminal block 12 mounted on an exterior of the main frame 3 and an electrical coupling to the conductive bar 11. The terminal block 12 is coupled, via a connection cable C, to a power input of the secondary distribution box 2 for electrical energy to be supplied to the secondary distribution box 2. The use of an output power busbar to deliver an output power to the secondary distribution box 2 makes it possible to use high-power modules whilst reducing the total number of connectors and the number of necessary electrical protectors.

In some embodiments, the last two power housings 45 and 46 are each dedicated to secondary power, each secondary power being weaker than the power delivered in each of the high-power housings 41, 42, 43, and 44. In these embodiments, the primary distribution box 2 thus comprises a primary distribution module including the power housings 41, 42, 43, and 44, configured to each receive high power, and a secondary distribution module including the secondary power housings 45 and 46, each being configured to receive lower power.

The interface 6 also includes an internal power busbar 13 extending between the fourth high-power housing 44 and the first secondary power housing 45. The internal power busbar 13 is configured to be coupled to a power output of a power module inserted in the fourth high-power housing 44 and to thus supply a power module inserted in the first secondary power housing 45 on the basis of the power delivered at the output of this module.

In some embodiments, the interface 6 additionally includes a secondary power busbar 14 extending over the two secondary power housings 45 and 46, and extending over the control housings 5. The secondary power busbar 14 is electrically connected to the internal busbar 13. The electrical connection can be provided via the power module inserted in the first secondary power housing 45 or via an electrical connection directly provided between the two busbars 13 and 14 over the interface 6. The secondary power busbar 14 makes it possible to supply electricity to the control modules inserted in the control housings 5 and the power module inserted in the second secondary power housing 46.

The interface 6 includes an individual output control connector 15 mounted on the main frame 3 opposite each control housing 5, so as to be connected at the output of a control module inserted in one of the five control housings 5. The individual output control connectors 15 are configured to be connected to electrical loads that are to be controlled or to distribution boxes.

In some embodiments, the interface 6 may also include individual output power connectors each disposed in a power housing to be connected to a power module in order to supply a load, or to a secondary electrical distribution box. In this configuration, for the power housings 4 including both an output power busbar and an individual output power connector, the distribution box may be used regardless of the configuration of connection of the power modules to deliver the output power.

In some embodiments, the primary distribution box 1 additionally includes, as illustrated in FIG. 1, two additional frames 16 fixed to the main frame 3. Each of the additional frames includes a control housing 5. The control housing 5 of each of the two additional frames 16 includes an individual input power connector 17 disposed on an outer face of each additional frame 16, and configured to be connected to a control module inserted in the corresponding control housing 5. Each of the individual input connectors 17 is adapted to receive a cable of the wiring harness.

In other embodiments, the individual input power connector 17 may be replaced or supplemented with an input power busbar, e.g., busbar 7, including a conductive bar, e.g., conductive bar 8, and a terminal block, e.g., terminal block 9, configured to be coupled to a cable of a wiring harness.

The control housing 5 of each of the two additional frames 16 also includes an individual output control connector 15 disposed on an outer face of each additional frame 16, and configured to be connected to a control module inserted in the corresponding control housing 5. The individual output control connector 15 of the control housing 5 of each additional frame 16 is adapted to be connected to electrical loads that are to be controlled or to distribution boxes.

In some embodiments, the interface 6 of the primary distribution box 1 includes a control motherboard 18. In these embodiments, the control motherboard 18 is mounted on the exterior of the distribution box 1, and in particular on the exterior of the main frame 3 and of the additional frames 16. Given this configuration, a single control motherboard 18 is thus used to connect both the control housing 5 of the main frame 3 and the control housings 5 of the two additional frames 16 to an external control unit. The interface 6 is configured to couple the external control motherboard 18 to a control connection board 20 mounted inside the main frame 3, for coupling the power modules and the control modules to the control motherboard 18. The fact that the control motherboard 18 is arranged externally allows the primary distribution box 1 to have a standard main frame 3 and also makes it possible to be able to choose the control motherboard 18 depending on the number of control modules used on the main frame 3, and on the additional frames 16 fixed to the main frame 3. The control motherboard 18 includes an input power connector 19.

In some embodiments, as illustrated in FIG. 1, the secondary distribution box 2 of the distribution system includes a main frame 23 and additional frames 36 fixed to the main frame 23, and an interface 26. Each additional frame 36 includes, similarly to the primary distribution box 1, a control housing 25 including in each case an individual input power connector 37 and an individual control connector 35.

The main frame 23 of the secondary distribution box 2 comprises a power module including a power housing 24, and a control module including a control housing 25. Mounted on the main frame 23, the interface 26 also includes an input power busbar 27 formed of a conductive bar 28 arranged inside the main frame 23, and a terminal block 29 mounted on the outside of the main frame 23 and electrically coupled to the conductive bar 28. The terminal block 29 is electrically connected to the output power busbar 10 of the primary distribution box 1, which thus supplies electricity to the secondary distribution box 2.

The interface 26 of the secondary distribution box 2 additionally includes an individual output power connector 30 disposed opposite to the power housing 24 of the secondary distribution box 2, and at least one output control connector 35 disposed opposite to the control housing 25 in the main frame 23. The interface 26 of the secondary distribution box 2 also includes a control motherboard 38 mounted on an outer face of the main frame 23, and two additional frames 36 to be connected to the control housings 25 of the main frame 23 and of the additional frames 36, as well as to the power housing 24 of the main frame 23.

The exemplary embodiments illustrated in FIG. 1 are not limiting, and any combination of features described between the secondary distribution box 2 and the primary distribution box 1 in particular does not depart from the scope of the various embodiments of this disclosure.

The various embodiments of this disclosure thus are directed to providing an electrical system including at least one distribution box which is optimized in terms of weight, cost, use and maintenance, by using a busbar as an electrical connector between modules inserted in the distribution box and the electrical elements disposed at an exterior of the distribution box.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electrical distribution box for an aircraft, comprising:
   first housings configured to receive power modules;
   second housings configured to receive electronic control modules; and
   an interface configured for connection for each of the power and control modules and external electrical members,
   wherein the interface comprises at least one input power busbar extending into at least a first of the first housings for connection to at least one power module of the power modules, and the at least one input power busbar is:
      adapted to be connected to a cable of a wiring harness for connection of the at least one power module to the wiring harness; and
      configured to provide power to the at least one power module.

2. The electrical distribution box according to claim 1, wherein the interface further comprises at least one output power busbar extending into the first of the first housings for connection to the at least one power module to supply a load, or for connection within the electrical distribution box or to an other electrical distribution box.

3. The electrical distribution box according to claim 2, wherein the interface further comprises at least one individual output power connector extending into a second of the first housings for connection to another power module of the power modules in order to supply the load, or for the connection within the electrical distribution box or to the other electrical distribution box.

4. The electrical distribution box according to claim 1, further comprising at least one individual input power connector extending into the first of the first housings for connection to the at least one power module of the power modules or another of the power modules, the at least one individual input power connector being adapted to receive the cable of the wiring harness.

5. The electrical distribution box according to claim 4, wherein each of the first housings comprises both the at least one individual input power connector and the at least one input power busbar, and an electrical connection exists between the at least one input power busbar and the at least one individual input power connector.

6. The electrical distribution box according to claim 1, further comprising:
   a control motherboard; and
   a main frame including the first and second housings,
      wherein the control motherboard is mounted on an exterior of the main frame and is configured to be connected to at least one of the first housings or the second housings.

7. The electrical distribution box according to claim 6, wherein the control motherboard comprises an input power connector.

8. The electrical distribution box according to claim 6, further comprising at least one additional frame for fixing to the main frame,
   wherein the at least one additional frame includes at least one of the second housings, and the control motherboard is mounted on an exterior of the at least one additional frame for connection to the at least one of the second housings of the at least one additional frame.

9. The electrical distribution box according to claim 1, wherein:
   the at least one input power busbar is a first input power busbar;
   the at least one power module is a first power module;
   the first input power busbar further extends into at least a second of the first housings for connection to at least two power modules of the power modules, the at least two power modules including the first power module and a second power module of the power modules; and
   the first input power busbar is adapted to be connected to the cable of the wiring harness for connection of the at least two power modules to the wiring harness.

10. The electrical distribution box of claim 9, wherein:
    the interface further comprises a second input power busbar distinct from the first input power busbar; and
    the second input power busbar extends into at least two of the second housings for connection to at least two control modules of the control modules.

11. The electrical distribution box of claim 10, wherein the second input power busbar further extends into at least one of the first housings for connection to the at least one power module of the power modules or another of the power modules.

12. An electrical distribution system, comprising at least one electrical distribution box, wherein the at least one electrical distribution box comprises:
    first housings configured to receive power modules;
    second housings configured to receive electronic control modules; and
    an interface configured for connection for each of the power and control modules and external electrical members, and
    wherein the interface comprises at least one input power busbar extending into at least a first of the first housings for connection to at least one power module of the power modules, and the at least one input power busbar is:
       adapted to be connected to a cable of a wiring harness for connection of the at least one power module to the wiring harness; and
       configured to provide power to the at least one power module.

13. The electrical distribution system according to claim 12, wherein the interface further comprises at least one output power busbar extending into the first of the first housings for connection to the at least one power module to supply a load, or for connection within the at least one electrical distribution box or to an other electrical distribution box.

14. The electrical distribution system according to claim 13, wherein the interface further comprises at least one individual output power connector extending into a second of the first housings for connection to another power module of the power modules in order to supply the load, or for the connection within the electrical distribution box or to the other electrical distribution box.

15. The electrical distribution system according to claim 12, further comprising at least one individual input power connector extending into the first of the first housings for connection to the at least one power module of the power modules or another of the power modules, the at least one individual input power connector being adapted to receive the cable of the wiring harness.

16. The electrical distribution system according to claim 15, wherein each of the first housings comprises both the at least one individual input power connector and the at least one input power busbar, and an electrical connection exists between the at least one input power busbar and the at least one individual input power connector.

17. The electrical distribution system according to claim 12, further comprising:
    a control motherboard; and
    a main frame including the first and second housings,
    wherein the control motherboard is mounted on an exterior of the main frame and is configured to be connected to at least one of the first housings or the second housings.

18. The electrical distribution system according to claim 17, wherein the control motherboard comprises an input power connector.

19. The electrical distribution system according to claim 12, wherein:
    the at least one input power busbar is a first input power busbar;
    the at least one power module is a first power module;
    the first input power busbar further extends into at least a second of the first housings for connection to at least two power modules of the power modules, the at least two power modules including the first power module and a second power module of the power modules; and
    the first input power busbar is adapted to be connected to the cable of the wiring harness for connection of the at least two power modules to the wiring harness.

* * * * *